(12) United States Patent
Paek et al.

(10) Patent No.: US 8,084,778 B2
(45) Date of Patent: Dec. 27, 2011

(54) LIGHT EMITTING DIODE PACKAGE

(75) Inventors: Ho Sun Paek, Gyunggi-do (KR); Hak Hwan Kim, Gyunggi-do (KR); Young Jin Lee, Seoul (KR); Hyung Kun Kim, Gyunggi-do (KR); Suk Ho Jung, Gyunggi-do (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 24 days.

(21) Appl. No.: 12/571,751

(22) Filed: Oct. 1, 2009

(65) Prior Publication Data

US 2010/0171143 A1  Jul. 8, 2010

(30) Foreign Application Priority Data

Oct. 27, 2008 (KR) .................. 10-2008-0105536

(51) Int. Cl.
*H01L 33/00* (2010.01)

(52) U.S. Cl. .......... 257/99; 257/100; 257/706; 257/720; 257/722; 257/783; 257/E33.056; 257/E33.066; 257/E33.076; 257/E23.06; 257/E23.066; 257/E23.087; 257/E23.11; 438/26; 438/29; 438/120; 438/137

(58) Field of Classification Search ............ 257/81, 257/99, 100, 706, 720, 722, 783, E33.056, 257/E33.062, E33.066, E33.076, E23.06, 257/E23.061, E23.066, E23.087, E23.088, 257/E23.101–E23.105, E23.11; 438/26, 438/29, 106, 120–127
See application file for complete search history.

(56) References Cited

U.S. PATENT DOCUMENTS

| | | | |
|---|---|---|---|
| 2007/0018190 A1* | 1/2007 | Kim et al. | 257/99 |
| 2008/0224160 A1* | 9/2008 | Chang et al. | 257/98 |

FOREIGN PATENT DOCUMENTS

| | | |
|---|---|---|
| JP | 2004-281996 | 10/2004 |
| KR | 10-2003-0062116 A | 7/2003 |

* cited by examiner

*Primary Examiner* — Lynne Gurley
*Assistant Examiner* — Meiya Li
(74) *Attorney, Agent, or Firm* — McDermott Will & Emery LLP

(57) ABSTRACT

There is provided an LED package having high heat dissipation efficiency. An LED package according to an aspect of the invention may include: a package body including a first groove portion being recessed into the package body and provided as a mounting area on the top of the package body; first and second lead frames arranged on a lower surface of the first groove portion while parts of the first and second lead frames are exposed; an LED chip mounted onto the lower surface of the first groove portion and electrically connected to the first and second lead frames; and a plurality of heat dissipation patterns provided on the bottom of the package body and formed of carbon nanotubes.

9 Claims, 3 Drawing Sheets

LIGHT EMITTING DIODE PACKAGE

CROSS-REFERENCE TO RELATED APPLICATIONS

This application claims the priority of Korean Patent Application No. 10-2008-0105536 filed on Oct. 27, 2008, in the Korean Intellectual Property Office, the disclosure of which is incorporated herein by reference.

BACKGROUND OF THE INVENTION

1. Field of the Invention

The present invention relates to LED packages, and more particularly, to an LED package having a high dissipation structure including carbon nanotubes.

2. Description of the Related Art

In general, light emitting diodes (LEDs) emit light by converting energy, generated when the injected electrons and holes recombine, into light. Examples of LEDs may include red LEDs using GaAsP and green LEDs using GaP. Nitride semiconductors using nitrides including GaN have recently attracted attention as the core material of photoelectric materials and electronic devices because of their excellent physical and chemical characteristics. Nitride semiconductor LEDs have correspondingly come into prominence. Nitride semiconductor LEDs can generate green, blue and ultraviolet light. As the luminance of nitride semiconductors has increased tremendously with technological advancements, nitride semiconductors have also been used in many applications ranging from full color displays to lighting apparatuses. Various kinds of packages having LEDs mounted therein are manufactured according to applications.

In order to apply LEDs to areas requiring high luminance, such as lighting apparatuses, the power consumption of LEDs needs to be increased. This causes LEDs to generate large amounts of heat. When the generated heat cannot be effectively dissipated to the outside of packages, the characteristics of LEDs may be changed or LED life time may be reduced.

In the related art, in order to improve heat dissipation, an LED package includes a heat dissipation unit using a metal, such as Cu, Al or Ag, which has excellent thermal conductivity. Theses metals including Cu, Al and Ag are known for their low thermal resistance and high thermal conductivity. However, these metals are susceptible to oxidation in the air, and voids are formed due to the movement of electrons caused when voltage is applied. As a result, heat dissipation is not effectively performed, lowering the operating characteristics and reliability of LEDs.

SUMMARY OF THE INVENTION

An aspect of the present invention provides an LED package that can increase heat dissipation efficiency by forming heat dissipation patterns formed of carbon nanotubes on the bottom of a package body onto which an LED chip is mounted.

According to an aspect of the present invention, there is provided an LED package including: a package body including a first groove portion having a concave shape and provided as a mounting area on the top of the package body; first and second lead frames arranged on a lower surface of the first groove portion while parts of the first and second lead frames are exposed; an LED chip mounted onto the lower surface of the first groove portion and electrically connected to the first and second lead frames; and a plurality of heat dissipation patterns provided on the bottom of the package body and formed of carbon nanotubes.

The plurality of heat dissipation patterns may be arranged in a matrix array.

The plurality of heat dissipation patterns arranged in the matrix array may be separated from each other at intervals of 3 µm to 10 µm.

The plurality of heat dissipation patterns may include rectangular patterns, triangular patterns and circular patterns.

The package body may further include a second groove portion being a cavity in an area of the bottom thereof corresponding to the first groove portion.

The plurality of heat dissipation patterns may be provided inside the second groove portion of the bottom of the package body.

The package body may further include at least two support protrusions on both end portions of the bottom thereof to protect the plurality of heat dissipation patterns.

The support protrusions may have a height equal to or greater than the plurality of heat dissipation patterns.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
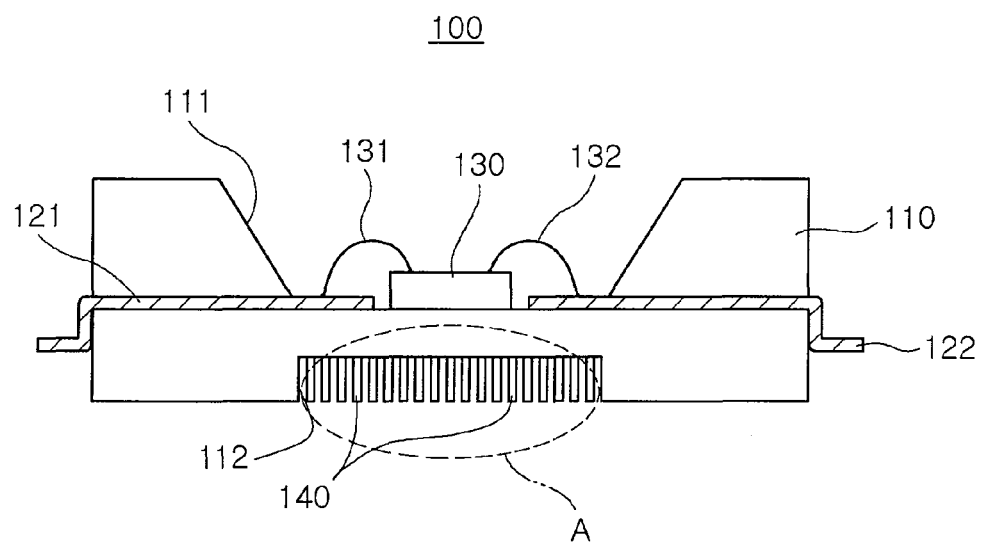
FIG. 1 is a view illustrating an LED package according to an exemplary embodiment of the present invention.

FIG. 1 is a view illustrating an LED package according to an exemplary embodiment of the invention. Referring to FIG. 1, an LED package 100 according to this embodiment includes a package body 110, a first lead frame 121, a second lead frame 122, an LED chip 130, a first wire 131, a second wire 132 and a plurality of heat dissipation patterns 140.

The package body 110 includes a first groove portion 111 that is formed on the top thereof and a second groove portion 112 that is formed on the bottom thereof. Specifically, the first groove portion 111 is formed to mount the LED chip 130 therein and is recessed into the package body 110. Here, the first groove portion 111 has inner side walls that are inclined from a lower surface thereof to an upper surface thereof so that light, emitted from the LED chip 130, reflects off the inner side walls and moves outwards. To more efficiently obtain the above-described effects, reflective films (not shown) having high reflectivity may be further formed on the inner side walls of the first groove portion 111.

Further, the second groove portion 112 is formed to dissipate the heat generated from the LED chip 130 mounted onto the lower surface of the first groove portion 111. The second groove portion 112 forms a cavity in the package body 110. Here, for heat dissipation, the second groove portion 112 may preferably be formed at a region of the bottom of the package body 110 that corresponds to the first groove portion 111.

The first and second lead frames 121 and 122 are mounted onto the package body 110 so that parts of the first and second lead frames 121 and 122 are exposed through the first groove portion 111 of the package body 110. The first and second lead frames 121 and 122 are electrically connected to the LED chip 130 through the first and second wires 131 and 132, respectively, thereby applying currents, which are externally controlled, to the LED chip 130.

The plurality of heat dissipation patterns 140 are formed under the package body 110. Specifically, the heat dissipation patterns 140 may be formed inside the second groove portion 112 of the package body 110. Here, the plurality of heat dissipation patterns 140 are formed of carbon nanotubes and may be any one of rectangular patterns, triangular patterns and circular patterns.

Carbon nanotubes used to form the plurality of heat dissipation patterns 140 have a thermal conductivity of approximately 2000 W/mK to 3000 W/mK. When compared to copper (thermal conductivity of 400 W/mK) or aluminum (thermal conductivity of 236 W/mK) which is well-known for its good thermal conductivity, carbon nanotubes have very high levels of thermal conductivity. Therefore, the plurality of heat dissipation patterns 140, formed of carbon nanotubes, are formed in the second groove portion 112 of the package body 110, thereby improving the heat dissipation efficiency of the LED package 100. Carbon nanotubes will be described below in detail.

The plurality of heat dissipation patterns 140 may be arranged in a matrix array. Here, the plurality of heat dissipation patterns 140, arranged in the matrix array, are preferably separated from each other at intervals within the range of approximately 3 μm to 10 μm. Here, an air layer, formed between the plurality of heat dissipation patterns 140 separated from each other, allows heat to be dissipated to the outside more quickly.

Further, as the intervals between the plurality of heat dissipation patterns 140 are reduced to minimum values, an air layer is ensured and at the same time, the surface area for heat dissipation increases. Accordingly, the heat dissipation efficiency of the LED package 100 can be improved.

In the LED package 100, shown in FIG. 1, the package body 110 is formed of an insulator. However, the package body 110 may also be formed of a conductive substrate. In this case, an insulating film (not shown), formed of $SiO_2$, may preferably be formed on the package body 110, particularly, on a part on which the LED chip 130 is mounted, and parts which the first and second lead frames 121 and 122 are in contact with.

Figure 2:
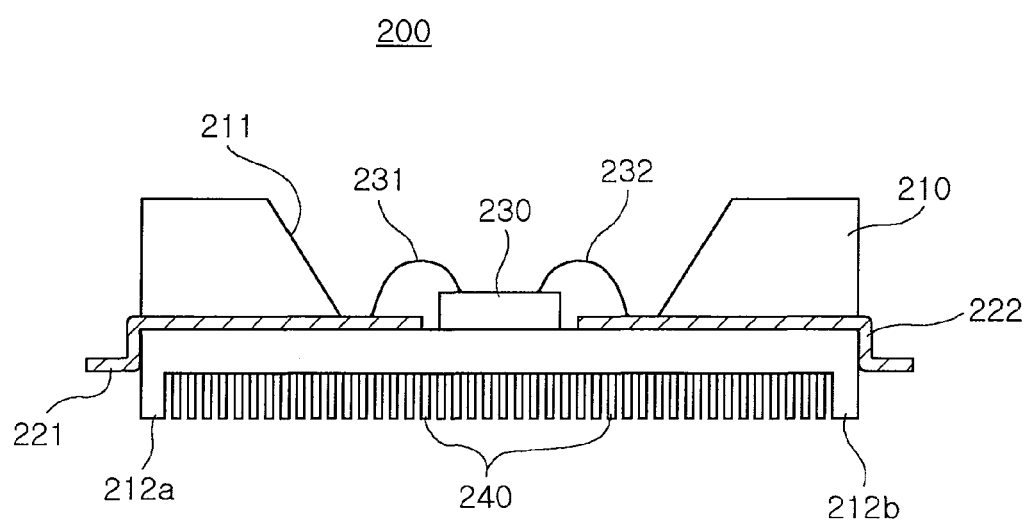
FIG. 2 is a view illustrating an LED package according to another exemplary embodiment of the present invention.

FIG. 2 is a view illustrating an LED package according to another exemplary embodiment of the invention. Referring to FIG. 2, an LED package 200 according to this embodiment includes a package body 210, first and second lead frames 221 and 222, an LED chip 230, a first wire 231, a second wire 232 and a plurality of heat dissipation patterns 240. In FIG. 2, a description of the same configuration and functions, described in FIG. 1, will be omitted.

The package body 210 includes a first groove portion 211 that is formed on the top thereof and at least two support projections 212a and 212b that are formed on both end portions of the bottom thereof. Specifically, the first groove portion 211 is formed to mount the LED chip 230 therein and is recessed into the package body 210.

The support projections 212a and 212b are located at both end portions of the bottom of the package body 210. The support projections 212a and 212b allow the package body 210 to be separated from the floor by a predetermined height. As the bottom of the package body 210 is separated from the bottom, the plurality of heat dissipation patterns 240, formed on the bottom of the package body 210, can be protected against external force. To this end, the support projections 212a and 212b may preferably be equal to or greater than the height of the plurality of heat dissipation patterns 240. For example, when the plurality of heat dissipation patterns 240 are approximately 1 mm high, the support projections 212a and 212b need to be 1 mm high or higher, so as to prevent damage to the plurality of heat dissipation patterns 240.

Even though one support protrusion is formed on each of the two end portions of the bottom of the package body 210 as shown in FIG. 2, the number of support protrusions is not limited thereto and a larger number of support protrusions may be formed.

The plurality of heat dissipation patterns 240 are formed of carbon nanotubes, and may be formed on the entire bottom of the package body 210. Here, when compared to the LED package 100, shown in FIG. 1, the plurality of heat dissipation patterns 240 can have a larger area. Therefore, when patterns having the same height and size are formed, the plurality of heat dissipation patterns 240, shown in FIG. 2, have an increased surface area for heat dissipation to thereby improve heat dissipation efficiency.

Figure 3A:
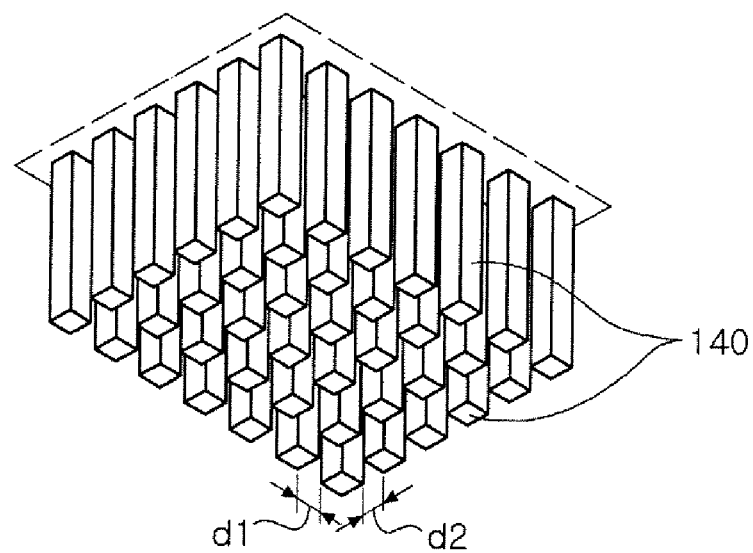
FIG. 3 is a view illustrating one area of the LED package, illustrated in FIG. 1.
Figure 3B:
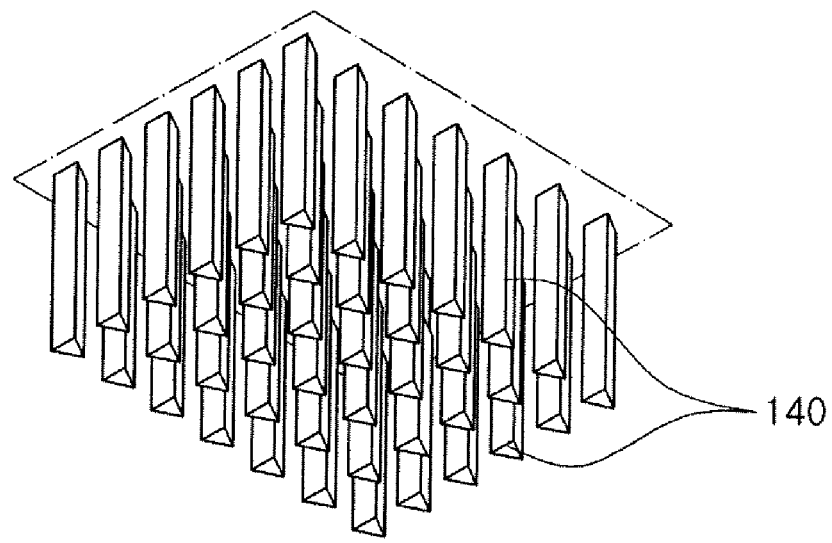
Figure 3C:
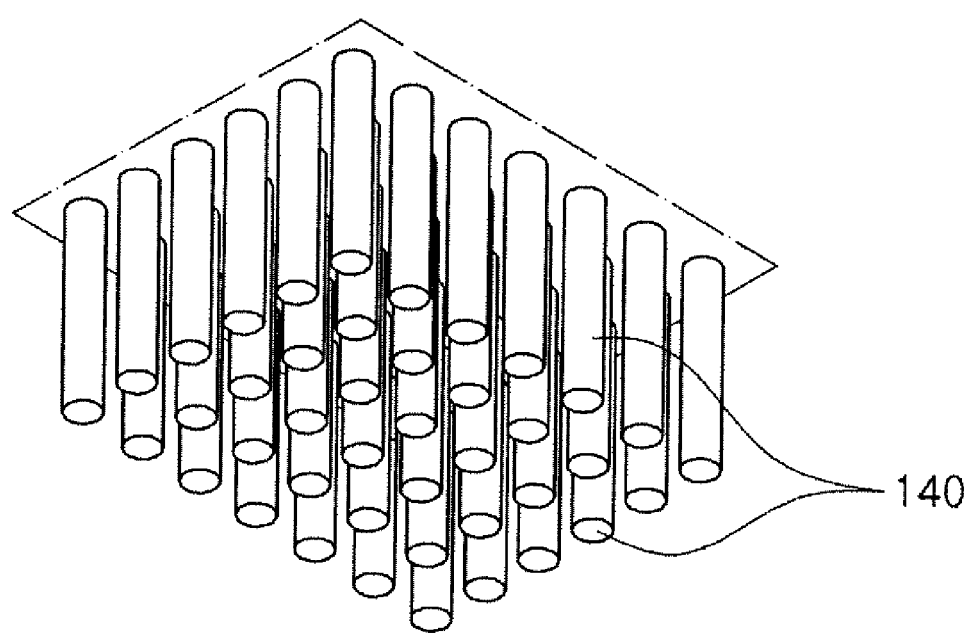

FIG. 3 is a view illustrating one area of the LED package illustrated in FIG. 1. Here, FIG. 3 is an enlarged view of an area A of the LED package 100, illustrated in FIG. 1, showing the plurality of heat dissipation patterns 140. A description, given with reference to FIG. 3, will be made on the basis of FIG. 1. However, this description may also be equally applied to the plurality of heat dissipation patterns 240, illustrated in FIG. 2.

When the area A, illustrated in FIG. 1, is enlarged, the plurality of heat dissipation patterns 140 have rectangular patterns and are connected to the second groove portion 112 while the heat dissipation patterns 140 are perpendicular to the second groove portion 112. Here, the plurality of heat dissipation patterns 140 may be formed of carbon nanotubes.

A carbon nanotube has a hexagonal network of carbon atoms that is rolled up to make a tube. In the hexagonal network, one carbon atom is bonded to another carbon atom. A carbon nanotube ranges from several nanometers to tens of nanometers in diameter. Since these carbon nanotubes have high thermal conductivity and a higher degree of hardness than diamond, they are expected to be widely used in high-technology electronics industry as well as in daily use.

Nanotubes are categorized as single-walled nanotubes (SWNTs) having one tube, double-walled nanotubes (DWNTs) having two tubes overlapping one another, and multi-walled carbon nanotubes (MWNTs). As a carbon nanotube, any one of a metal-carbon nanotube, a high polymer-carbon nanotube and a liquid-carbon nanotube may be used. These carbon nanotubes can be synthesized by plasma-enhanced chemical vapor deposition (PECVD).

PECVD can synthesize carbon nanotubes at relatively low temperatures and allows selective growth. PECVD is appropriate for the direct growth of carbon nanotubes on a support body such as the package body 110. Specifically, PECVD is performed in such a way that while the package body 110 is located in a chamber (not shown), metals including Fe, Ni and Co are deposited using sputtering so that a catalytic metal layer (not shown) is formed on the package body 110. Then, the catalytic metal layer is etched using ammonia and hydrogen gas to form a catalytic metal layer having nano-sized fine patterns. Here, etching time may be controlled to control the particle size and density of the catalytic metal layer.

Then, in order to synthesize carbon nanotubes, while reaction gas formed of at least one of acetylene ($C_2H_2$), methane ($CH_4$), ethylene ($C_2H_4$), propylene ($C_3H_6$), propane ($C_3H_8$) and carbon monoxide (CO) is supplied to the interior of the chamber, high-frequency power is applied so that carbon nanotubes can be grown on the catalytic metal layer while they are perpendicularly arranged. Here, the size of the patterns, formed of carbon nanotubes, can be controlled by controlling the processing time.

By the above-described method, the plurality of heat dissipation patterns 140 are selectively grown and arranged into a matrix array as shown in FIG. 3. One heat dissipation pattern 140 is separated from another dissipation pattern 140, adjacent to the heat dissipation pattern 140 in a horizontal direction, by a first distance d1. At the same time, one heat dissipation pattern 140 is separated from another dissipation pattern 140, adjacent to the heat dissipation pattern 140 in a vertical direction, by a second distance d2. Here, each of the first and second distances d1 and d2 is in the range of 3 μm to 10 μm. The first and second distances d1 and d2 may be equal to or different from each other.

As shown in FIG. 3, as the plurality of heat dissipation patterns 140 are separated from each other by the first and second distances d1 and d2, an air layer exists therebetween. Therefore, heat generated from the LED chip 130 can be transmitted and dissipated to the outside through the plurality of heat dissipation patterns 140, formed of carbon nanotubes, and the heat can be more smoothly dissipated through the air layer. Accordingly, the heat dissipation efficiency of the LED package 100 is improved, and thus the life span of the LED package 100 can be extended.

As set forth above, according to exemplary embodiments of the invention, as a plurality of heat dissipation patterns, formed of carbon nanotubes having high thermal conductivity, are formed on the bottom of a package body onto which an LED chip is mounted, the heat dissipation efficiency of an LED package increases to extend life span of the LED package.

While the present invention has been shown and described in connection with the exemplary embodiments, it will be apparent to those skilled in the art that modifications and variations can be made without departing from the spirit and scope of the invention as defined by the appended claims.

What is claimed is:

1. An LED package comprising:
    a package body including a first groove portion being recessed into the package body and provided as a mounting area on a top of the package body and a second groove portion being on an area of a bottom of the package body corresponding to the first groove portion;
    first and second lead frames arranged on a lower surface of the first groove portion while parts of the first and second lead frames are exposed;
    an LED chip mounted onto the lower surface of the first groove portion and electrically connected to the first and second lead frames; and
    a plurality of heat dissipation patterns provided on the area of the bottom of the package body and formed of carbon nanotubes,
    wherein the heat dissipation patterns are separated from each other such that air fills between the heat dissipation patterns.

2. The LED package of claim 1, wherein the plurality of heat dissipation patterns are arranged in a matrix array.

3. The LED package of claim 2, wherein the plurality of heat dissipation patterns arranged in the matrix array are separated from each other at intervals of 3 μm to 10 μm.

4. The LED package of claim 1, wherein the plurality of heat dissipation patterns comprise rectangular patterns, triangular patterns and circular patterns.

5. The LED package of claim 1, wherein the plurality of heat dissipation patterns are provided inside the second groove portion of the bottom of the package body.

6. The LED package of claim 1, wherein the package body further comprises at least two support protrusions on both end portions of the bottom of the package body to protect the plurality of heat dissipation patterns.

7. The LED package of claim 6, wherein the support protrusions have a height equal to or greater than the plurality of heat dissipation patterns.

8. The LED package of claim 1, wherein the plurality of heat dissipation patterns are made of grown carbon nanotubes.

9. The LED package of claim 1, where the plurality of heat dissipation patterns extend in a direction substantially perpendicular to the bottom of the package body.

* * * * *